United States Patent
Chang (10) Patent No.: US 9,236,012 B2
(45) Date of Patent: Jan. 12, 2016

(54) SENSING APPARATUS OF DISPLAY PANEL

(71) Applicant: HIMAX TECHNOLOGIES LIMITED, Tainan (TW)

(72) Inventor: Chun-Chi Chang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 14/278,966

(22) Filed: May 15, 2014

(65) Prior Publication Data

US 2015/0332630 A1    Nov. 19, 2015

(51) Int. Cl.
*G09G 3/32* (2006.01)
*H03F 3/45* (2006.01)
*H03F 3/68* (2006.01)

(52) U.S. Cl.
CPC .......... *G09G 3/3291* (2013.01); *H03F 3/45179* (2013.01); *H03F 3/68* (2013.01); *G09G 2300/0819* (2013.01); *G09G 2300/0833* (2013.01); *G09G 2310/0291* (2013.01); *G09G 2320/045* (2013.01); *H03F 2200/471* (2013.01); *H03F 2203/45116* (2013.01)

(58) Field of Classification Search
CPC .. G09G 2320/029; H03F 3/68; H03F 3/45179
See application file for complete search history.

(56) References Cited

U.S. PATENT DOCUMENTS 3,781,694 A * 12/1973 Lefevre et al. ................ 327/335
8,576,217 B2 * 11/2013 Chaji et al. .................... 345/212
8,599,191 B2 * 12/2013 Chaja et al. ................... 345/212
2006/0279321 A1 * 12/2006 Ruppender et al. ........... 324/770
2006/0284603 A1 * 12/2006 Nehrig et al. .................. 320/167
2008/0224972 A1    9/2008 Nakajima et al.
2008/0238833 A1 * 10/2008 Hioki et al. ..................... 345/76
2011/0109660 A1 *  5/2011 Kim .............................. 345/690
2014/0152642 A1 *  6/2014 Kim et al. ...................... 345/212
2014/0368415 A1 * 12/2014 Kim et al. ....................... 345/77

FOREIGN PATENT DOCUMENTS

TW         200910293        3/2009

OTHER PUBLICATIONS

"Office Action of Taiwan Counterpart Application", issued on Aug. 13, 2015, p. 1-3.

* cited by examiner

*Primary Examiner* — Sanjiv D Patel
(74) *Attorney, Agent, or Firm* — J.C. Patents (57) ABSTRACT

The sensing apparatus includes a sensor and a sampling amplifier. The sensor includes switches, capacitors and gain amplifiers. Second terminals of first and second switches respectively coupled to first and second terminals of third switch. First and second terminals of the first capacitor respectively coupled to a reference voltage and the second terminal of the first switch. Input terminals of the first and the second gain amplifiers respectively coupled to the second terminals of the first and the second switches, and output terminals of the first and the second gain amplifiers respectively coupled to the first and the second input terminals of the sampling amplifier. The first terminal of the second switch coupled to a common mode voltage. The first terminal of the first switch coupled to the pixel circuit via the data line of the display panel.

17 Claims, 5 Drawing Sheets

SENSING APPARATUS OF DISPLAY PANEL

BACKGROUND OF THE INVENTION

1. Field of the Invention

The invention relates to an electronic apparatus; more particularly, the invention relates to a sensing apparatus of a display panel.

2. Description of Related Art

Figure 1:
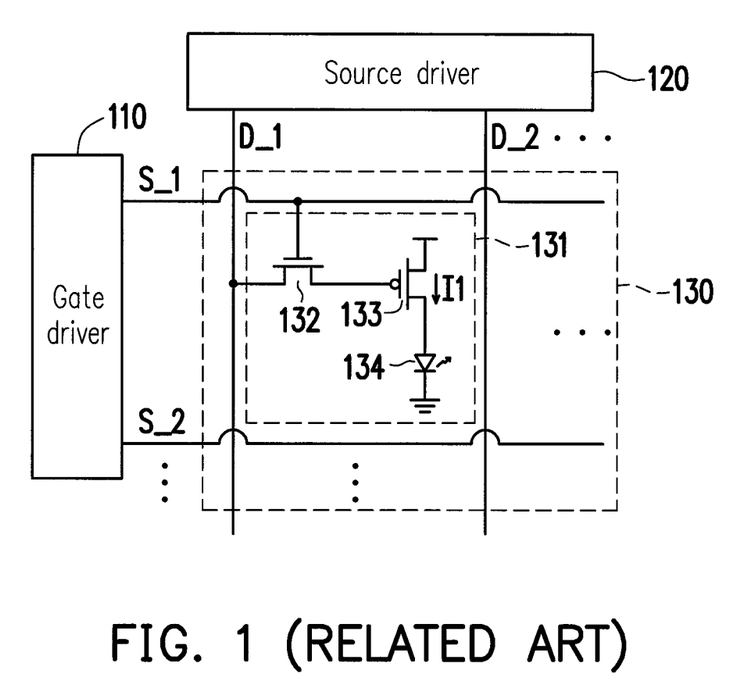
FIG. 1 is a block diagram illustrating circuitry of a conventional active matrix organic light emitting diode (AMOLED) display.

FIG. 1 is a block diagram illustrating circuitry of a conventional active matrix organic light emitting diode (AMOLED) display. The AMOLED display includes a gate driver 110, a source driver 120, and a display panel 130. The display panel 130 has a plurality of scan lines (for instance, scan lines S_1 and S_2 which are gate lines), a plurality of data lines (for instance, data lines D_1 and D_2 which are source lines), and a plurality of pixel circuits (e.g., a pixel circuit 131). The pixel circuit 131 has a switch 132, a current source transistor 133, and an organic light emitting diode (OLED) 134.

The gate driver 110 can sequentially scan the different scan lines of the display panel 130, so as to allow the source driver 120 to write the data voltage into the pixel circuit. As shown in FIG. 1, in the exemplary pixel circuit 131, while the gate driver 110 turns on the switch 132 via the scan line S_1, the source driver 120 can transmit the data voltage to the gate of the current source transistor 133 via the data line D_1 and the switch 132. The gate voltage of the current source transistor 133 may determine the current I1 of the current source transistor 133. The current I1 flowing through the OLED 134 may determine the brightness of the OLED 134. The formula expressing the relation between the gate source voltage $V_{GS}$ of the current source transistor 133 and the current I1 is $I1=k(V_{GS}-Vt)^2$, wherein the coefficient k is a real number, and Vt represents a threshold voltage of the current source transistor 133. Due to process drift or other factors, the threshold voltages of the current source transistors in different pixel circuits may differ from one another. The difference in the threshold voltages or the drift may lead to mura effects on images or other defects. If the threshold voltage of the current source transistor 133 may be measured, the source driver 120 is able to correspondingly adjust the data voltage to be written into the pixel circuit 131, so as to compensate the drift of the threshold voltage.

SUMMARY OF THE INVENTION

The invention is directed to a sensing apparatus of a display panel capable of sensing a threshold voltage of a current source transistor in a pixel circuit of the display panel.

In an embodiment of the invention, a sensing apparatus of a display panel is provided. The sensing apparatus includes a sensor and a sampling amplifier. An input terminal of the sensor is coupled to a pixel circuit of the display panel via a data line of the display panel, so as to sense a threshold voltage of a current source transistor in the pixel circuit during a sensing period. A first input terminal and a second input terminal of the sampling amplifier are coupled to a first output terminal and a second output terminal of the sensor, respectively. The sensor includes a first switch, a second switch, a third switch, a first capacitor, a first gain amplifier, and a second gain amplifier. A first terminal of the first switch is coupled to the pixel circuit via a data line of a display panel. A first terminal of the second switch is coupled to a common mode voltage. A first terminal and a second terminal of the third switch are respectively coupled to a second terminal of the first switch and a second terminal of the second switch. A first terminal and a second terminal of the first capacitor are respectively coupled to a first reference voltage and the second terminal of the first switch. An input terminal of the first gain amplifier is coupled to the second terminal of the first switch, and an output terminal of the first gain amplifier acts as the first output terminal of the sensor and is coupled to the first input terminal of the sampling amplifier. An input terminal of the second gain amplifier is coupled to the second terminal of the second switch, and an output terminal of the second gain amplifier acts as the second output terminal of the sensor and is coupled to the second input terminal of the sampling amplifier.

In another embodiment of the invention, a sensing apparatus of a display panel is provided. The sensing apparatus includes a sensor and a sampling amplifier. An input terminal of the sensor is coupled to a pixel circuit of the display panel via a data line of the display panel, so as to sense a threshold voltage of a current source transistor in the pixel circuit during a sensing period. A first input terminal and a second input terminal of the sampling amplifier are coupled to a first output terminal and a second output terminal of the sensor, respectively. The sampling amplifier includes a differential amplifier, a first capacitor, a second capacitor, a third capacitor, a fourth capacitor, a first switch, a second switch, a third switch, a fourth switch, a fifth switch, and a sixth switch. A first output terminal and a second input terminal of the differential amplifier are coupled to a first output terminal and a second output terminal of the sampling amplifier, respectively. A first terminal and a second terminal of the first capacitor are coupled to the first output terminal of the sensor and a first input terminal of the differential amplifier, respectively. A first terminal and a second terminal of the second capacitor are coupled to the second output terminal of the sensor and a second input terminal of the differential amplifier, respectively. A first terminal of the third capacitor is coupled to the first input terminal of the differential amplifier. A first terminal of the fourth capacitor is coupled to the second input terminal of the differential amplifier. A first terminal and a second terminal of the first switch are coupled to the first input terminal and the first output terminal of the differential amplifier, respectively. A first terminal and a second terminal of the second switch are respectively coupled to a second terminal of the third capacitor and a common mode voltage. A first terminal and a second terminal of the third switch are coupled to the second terminal of the third capacitor and the first output terminal of the differential amplifier, respectively. A first terminal and a second terminal of the fourth switch are coupled to the second input terminal and the second output terminal of the differential amplifier, respectively. A first terminal and a second terminal of the fifth switch are respectively coupled to a second terminal of the fourth capacitor and the common mode voltage. A first terminal and a second terminal of the sixth switch are coupled to the second terminal of the fourth capacitor and the second output terminal of the differential amplifier, respectively.

In view of the above, the sensing apparatus of the display panel provided in an embodiment of the invention is conducive to the reduction of the offset of the amplification circuit in the sensor and/or the sampling amplifier. Thereby, the sensing apparatus is able to accurately sense the threshold voltage of the current source transistor in the pixel circuit of the display panel.

Several exemplary embodiments accompanied with figures are described in detail below to further describe the invention in details.

DETAILED DESCRIPTION OF DISCLOSED EMBODIMENTS

The word "couple" in the description and claims may refer to any direct or indirect connection. For instance, in the description and claims, if a first device is coupled to a second device, it means that the first device may be directly connected to the second device or may be indirectly connected to the second device through another device or by another connection means. Moreover, elements/components/steps with same reference numbers represent the same or similar parts in the drawings and embodiments, and the descriptions of the same elements/components/steps in an embodiment of the invention may be applied to the descriptions of the same elements/components/steps in another embodiment.

Figure 2:
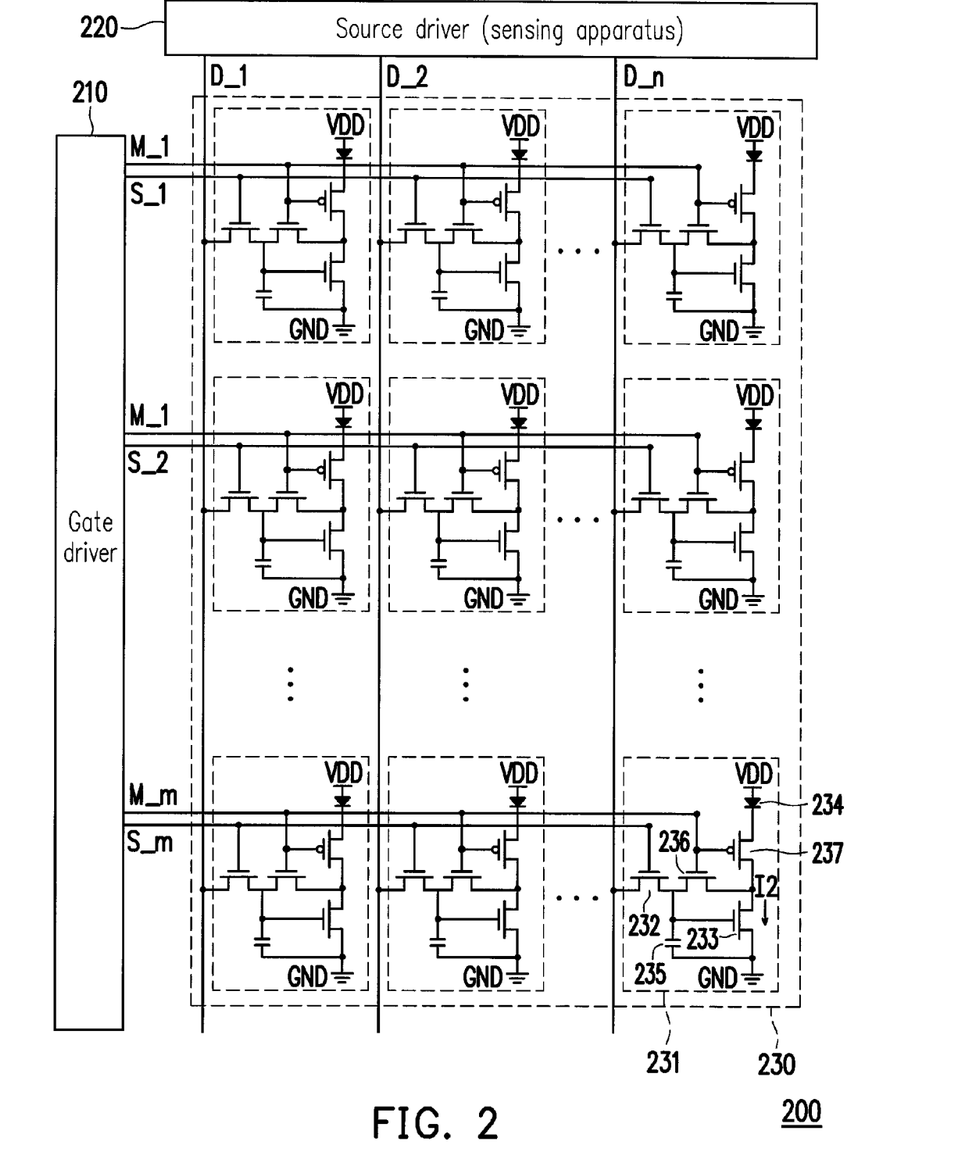
FIG. 2 is a schematic diagram illustrating circuitry of a display apparatus according to an embodiment of the invention.

FIG. 2 is a schematic diagram illustrating circuitry of a display apparatus 200 according to an embodiment of the invention. The display 200 includes a gate driver 210, a source driver 220, and a display panel 230. The display panel 230 has a plurality of scan lines (for instance, scan lines S_1, S_2, ..., and S_m which are gate lines), a plurality of data lines (for instance, data lines D_1, D_2, ..., and D_n which are source lines), and a plurality of pixel circuits (e.g., a pixel circuit 231). The pixel circuit 231 has a switch 232, a current source transistor 233, a light emitting diode (LED) 234, a storage capacitor 235, and switches 236 and 237. The LED 234 may be an OLED or an LED of another type. The descriptions of other pixel circuits in the display panel 130 may be deduced from the descriptions of the pixel circuit 231.

During a normal operational period, the gate driver 210 may set the signals of mode lines M_1, M_2, ..., and M_m to be at the first logic level (e.g., the low logic level). If the signals of the mode lines M_1, M_2, ..., and M_m are at the low logic level, the switch 236 of each pixel circuit in the display panel 230 is turned off, and the switch 237 is turned on. During the normal operational period, the gate driver 210 may further sequentially scan the different scan lines S_1 to S_m of the display panel 230, so as to allow the source driver 220 to write the data voltage into the pixel circuit via the data lines D_1 to D_n. As shown in FIG. 2, in the exemplary pixel circuit 231, while the gate driver 210 turns on the switch 232 via the scan line S_m, the source driver 220 can transmit the data voltage to the gate of the current source transistor 233 via the data line D_n and the switch 232. The data voltage can be stored in the storage capacitor 235. The gate voltage of the current source transistor 233 may determine the current I2 of the current source transistor 233. The current I2 flowing through the OLED 234 may determine the brightness of the OLED 234. The formula expressing the relation between the gate-source voltage $V_{GS}$ of the current source transistor 233 and the current I2 is $I2=k(V_{Gs}-Vt)^2$, wherein the coefficient k is a real number, and Vt represents a threshold voltage of the current source transistor 233.

During the sensing period, the gate driver 210 may set the signals of the mode lines M_1 to M_m to be at the second logic level (e.g., the high logic level). If the signals of the mode lines M_1 to M_m are at the high logic level, the switch 236 of each pixel circuit in the display panel 230 is turned on, and the switch 237 is turned off. During the sensing period, the switch 236 is turned on, such that the gate source voltage $V_{GS}$ of the current source transistor 233 may be pulled down to be close to 0V. The gate driver 210 may further sequentially scan the different scan lines S_1 to S_m of the display panel 230 during the sensing period, so as to allow the sensing apparatus 300 inside the source driver 220 to sense the threshold voltages of the current source transistors in different pixel circuits via the data lines D_1 to D_n. The sensing apparatus 300 will be described hereinafter. As shown in FIG. 2, in the exemplary pixel circuit 231, while the gate driver 210 turns on the switch 232 via the scan line S_m, the sensing apparatus 300 inside the source driver 220 can sense the threshold voltage of the current source transistor in the pixel circuit 231 via the data line D_n and the switch 232. After the threshold voltage of the current source transistor 233 is sensed, the source driver 220 is able to correspondingly adjust the data voltage to be written into the pixel circuit 231, so as to compensate the drift of the threshold voltage.

Figure 3:
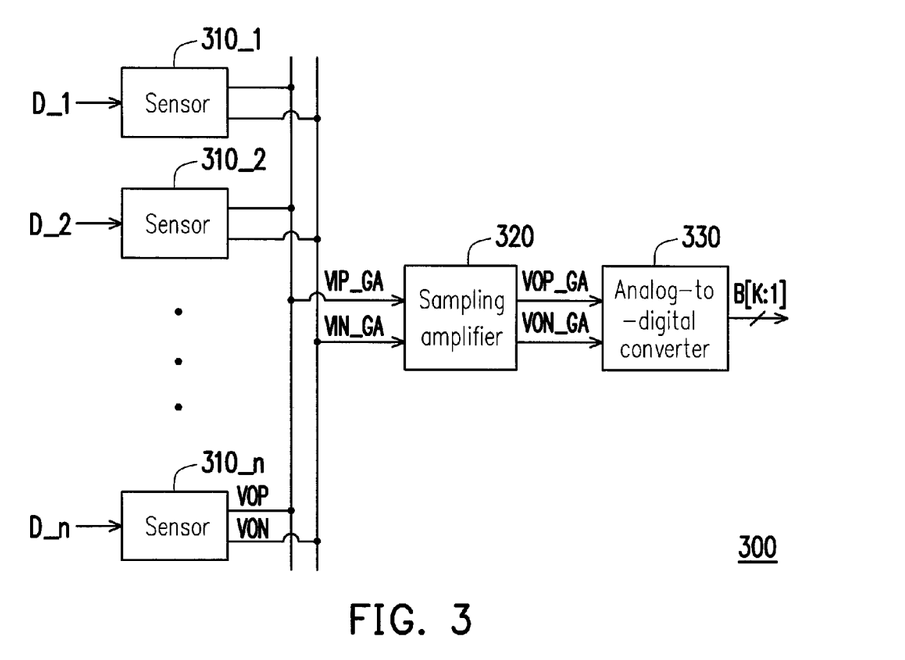
FIG. 3 is a schematic diagram illustrating circuitry of a sensing apparatus according to an embodiment of the invention.

FIG. 3 is a schematic diagram illustrating circuitry of the sensing apparatus 300 according to an embodiment of the invention. With reference to FIG. 2 and FIG. 3, the sensing apparatus 300 of the display panel 230 may be embedded into the source driver 220. The sensing apparatus 300 includes a sensor (e.g., the sensors 310_1, 310_2, ..., and 310_n shown in FIG. 3), a sampling amplifier 320, and an analog-to-digital converter 330. The output terminals of the sensors 310_1 to 310_n are one-on-one coupled to the data lines D_1 to D_n of the display panel 230, respectively. For instance, the input terminal of the sensor 310_n is coupled to the pixel circuit of the display panel 230 via the data line D_n of the display panel 230, so as to sense the threshold voltage of the current source transistor 233 in the pixel circuit 231 during the sensing period and output the sensed result to the input terminal of the sampling amplifier 320. The first input terminal VIP_GA and the second input terminal VIN_GA of the sampling amplifier 320 are coupled to the first output terminal and the second output terminal of each of the sensors 310_1 to 310_n, respectively, e.g., coupled to the first output terminal VOP and the second output terminal VON of the sensor 310_n. The sampling amplifier 320 is able to sample and amplify the output of the sensors 310_1 to 310_n and correspondingly output the analog detection result to the input terminal of the analog-to-digital converter 330. The analog-to-digital converter 330 can convert the analog detection result into the digital detection result B[K:1]. According to the digital detection result B[K:1] (or the analog detection result), the source driver 220 may correspondingly adjust the data voltage to be written into the pixel circuit, so as to compensate the drift of the threshold voltage.

Figure 4:
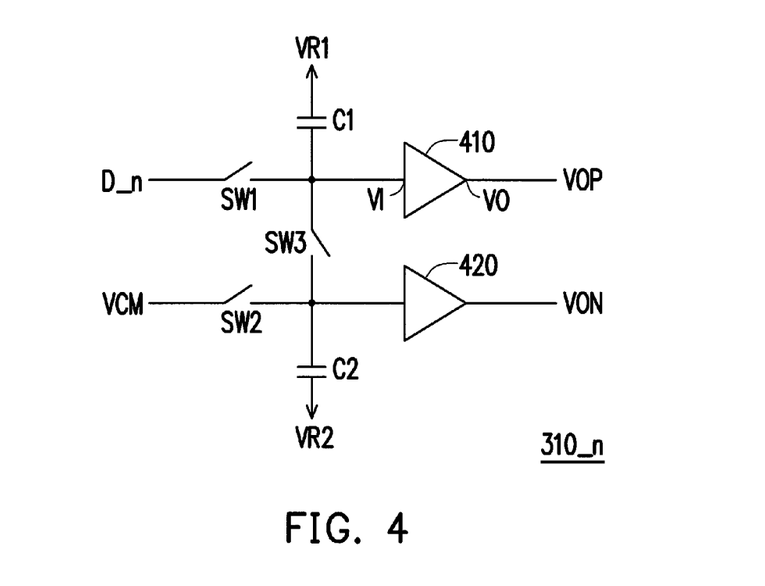
FIG. 4 is a schematic diagram illustrating circuitry of the sensor according to an embodiment of the invention, and the sensor is shown in FIG. 3.

FIG. 4 is a schematic diagram illustrating circuitry of the sensor 310_n according to an embodiment of the invention, and the sensor 310_n is shown in FIG. 3. Details of other sensors shown in FIG. 3 may be deduced from the details of the sensor 310_n provided above. With reference to FIG. 2, FIG. 3, and FIG. 4, the sensor 310_n includes a first switch SW1, a second switch SW2, a third switch SW3, a first capacitor C1, a second capacitor C2, a first gain amplifier 410, and a second gain amplifier 420. The first terminal of the first switch SW1 is coupled to the pixel circuit (e.g., the pixel circuit 231 or so) of the display panel 230 via the data line D_n. The first terminal of the second switch SW2 is coupled to a common mode voltage VCM. The first terminal and the second terminal of the third switch SW3 are respectively coupled to the second terminal of the first switch SW1 and the second terminal of the second switch SW2.

The first terminal and the second terminal of the first capacitor C1 are respectively coupled to a first reference voltage VR1 and the second terminal of the first switch SW1. The first reference voltage VR1 may be a fixed voltage at any level, e.g., a system voltage VDD, a ground voltage GND, or any other fixed voltage. The first terminal and the second terminal of the second capacitor C2 are respectively coupled to a second reference voltage VR2 and the second terminal of the second switch SW2. The second reference voltage VR2 may be a fixed voltage at any level, e.g., a system voltage VDD, a ground voltage GND, or any other fixed voltage. Besides, the first reference voltage VR1 may be the same as or different from the second reference voltage VR2.

The input terminal of the first gain amplifier 410 is coupled to the second terminal of the first switch SW1. The output terminal of the first gain amplifier 410 acts as the first output terminal VOP of the sensor 310_n and is coupled to the first input terminal VIP_GA of the sampling amplifier 320. The input terminal of the second gain amplifier 420 is coupled to the second terminal of the second switch SW2. The output terminal of the second gain amplifier 420 acts as the second output terminal VON of the sensor 310_n and is coupled to the second input terminal VIN_GA of the sampling amplifier 320. The first and second gain amplifiers 410 and 420 may be amplification circuits of any type. For instance, in the present embodiment, the first and second gain amplifiers 410 and 420 may be unit gain amplifiers.

When the display panel 230 is operated during the sensing period, in a first period (i.e., first phase) T1 of the sensing period, the first and second switches SW1 and SW2 are turned on, and the third switch SW3 is turned off. Hence, in the first period T1, the output VOP(T1) of the first gain amplifier 410 is D_n+$V_{offset1}$, and the output VON(T1) of the second gain amplifier 420 is VCM+$V_{offset2}$. Here, $V_{offset1}$ represents the voltage offset of the first gain amplifier 410, and $V_{offset2}$ represents the voltage offset of the second gain amplifier 420. In the first period T1, the sampling amplifier 320 may perform the following calculation: VOP(T1)−VON(T1)=(D_n+$V_{offset1}$)−(VCM+$V_{offset2}$). In a second period (i.e., second phase) T2 of the sensing period, the first switch SW1 and the second switch SW2 are turned off, and the third switch SW3 is turned on. Hence, in the second period T2, the output VOP(T2) of the first gain amplifier 410 is $V_{reset}$+$V_{offset1}$, and the output VON(T2) of the second gain amplifier 420 is $V_{reset}$+$V_{offset2}$. Here, $V_{reset}$ represents the voltage at the input terminals of the first gain amplifier 410 and the second gain amplifier 420 while the third switch SW3 is turned on. In the second period T2, the sampling amplifier 320 may perform the following calculation: VOP(T2)−VON(T2)=$V_{offset1}$−$V_{offset2}$, and the sampling amplifier 320 may then perform the following calculation: [VOP(T1)−VON(T1)]−[VOP(T2)−VON(T2)]=D_n−VCM. As a result, the voltage offset of the first and second gain amplifiers 410 and 420 may be removed.

Figure 5:
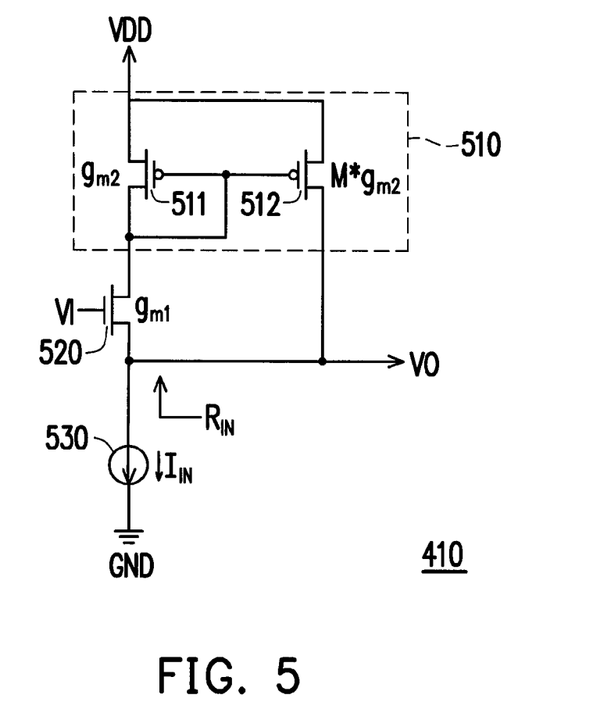
FIG. 5 is a schematic diagram illustrating circuitry of the gain amplifier according to an embodiment of the invention, and the gain amplifier is shown in FIG. 4.

The first and second gain amplifiers 410 and 420 may be amplification circuits of any type. For instance, FIG. 5 is a schematic diagram illustrating circuitry of the first gain amplifier 410 according to an embodiment of the invention, and the first gain amplifier 410 is shown in FIG. 4. Details of other gain amplifiers shown in FIG. 4 may be deduced from the details of the first gain amplifier 410 provided above. With reference to FIG. 5, the first gain amplifier includes a current mirror 510, a transistor 520, and a current source 530. In the present embodiment, the current mirror 510 includes p-channel metal oxide semiconductor (PMOS) transistors 511 and 512. The gate of the PMOS transistor 511 is coupled to the drain of the PMOS transistor 511 and the gate of the PMOS transistor 512. The PMOS transistor 511 is able to provide the master current path of the current mirror 510, and the PMOS transistor 512 is able to provide the slave current path of the current mirror 510. In the present embodiment, the channel length-width ratio of the PMOS transistor 512 may be M times the channel length-width ratio of the PMOS transistor 511. That is, if the transconductance of the PMOS transistor 511 is $g_{m2}$, the transconductance of the PMOS transistor 512 is $M*g_{m2}$.

The first terminal of the master current path and the first terminal of the slave current path of the current mirror 510 are coupled to a system voltage VDD, and the second terminal of the slave current path of the current mirror 510 is coupled to the output terminal VO of the first gain amplifier 410. The control terminal (e.g., the gate) of the transistor 520 is coupled to the input terminal VI of the first gain amplifier 410. The first terminal (e.g., the drain) of the transistor 520 is coupled to the second terminal of the master current path of the current mirror 510. One terminal of the current source 530 is coupled to the second terminal (e.g., the source) of the transistor 520 and the second terminal of the slave current path of the current mirror 510. The other terminal of the current source 530 is coupled to the ground voltage GND. If the current of the current source 530 is assumed to be $I_{IN}$, then $I_{IN}$=$g_{m1}$VI+

$$g_{m1}VI * \frac{1}{g_{m2}} * M * g_{m2} = (1+M)g_{m1}VI,$$

wherein $g_{m1}$ represents the transconductance of the transistor 520. The inner resistance $R_{IN}$ of the first gain amplifier 410 is $$\frac{VI}{I_{IN}} = \frac{VI}{(1+M)g_{m1}VI} = \frac{1}{(1+M)g_{m1}}.$$

Hence, the inner resistance $R_{IN}$ of the first gain amplifier 410 may be effectively reduced.

Figure 6:
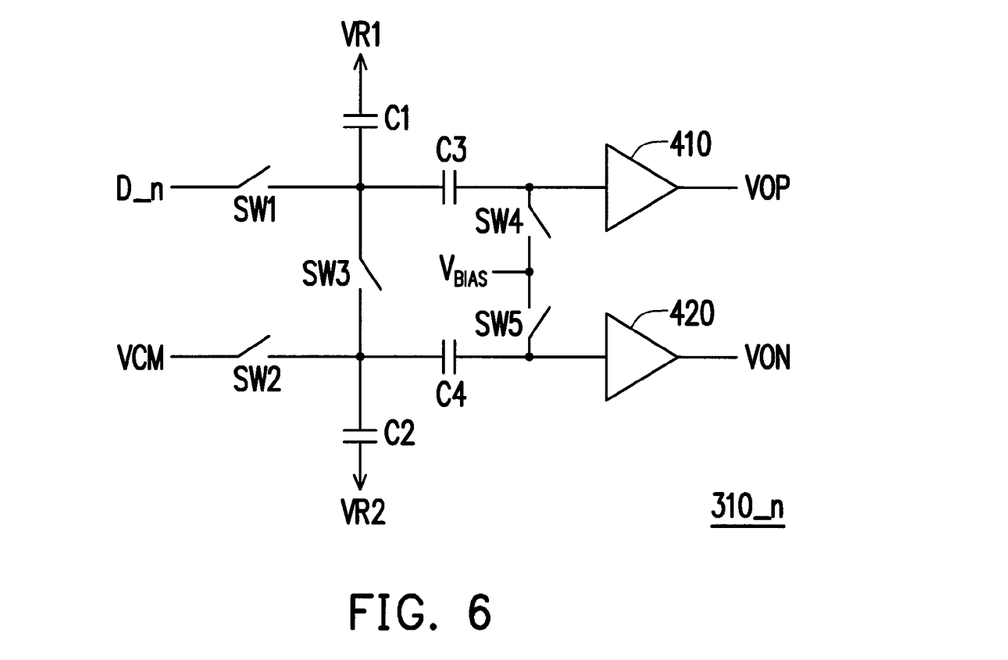
FIG. 6 is a schematic diagram illustrating circuitry of the sensor according to another embodiment of the invention, and the sensor is shown in FIG. 3.

FIG. 6 is a schematic diagram illustrating circuitry of the sensor 310_n according to an embodiment of the invention, and the sensor 310_n is shown in FIG. 3. Details of other sensors shown in FIG. 3 may be deduced from the details of the sensor 310_n provided above. With reference to FIG. 2, FIG. 3, and FIG. 6, the sensor 310_n includes a first switch SW1, a second switch SW2, a third switch SW3, a fourth switch SW4, a fifth switch SW5, a first capacitor C1, a second capacitor C2, a third capacitor C3, a fourth capacitor C4, a first gain amplifier 410, and a second gain amplifier 420. Details of the embodiment shown in FIG. 6 may be deduced from the descriptions shown in FIG. 4. The first terminal of the first switch SW1 is coupled to the pixel circuit (e.g., the pixel circuit 231 or so) of the display panel 230 via the data line D_n. The first terminal of the second switch SW2 is coupled to the common mode voltage VCM. The first terminal and the second terminal of the third switch SW3 are respectively coupled to the second terminal of the first switch SW1 and the second terminal of the second switch SW2.

The first terminal and the second terminal of the first capacitor C1 are respectively coupled to a first reference voltage VR1 and the second terminal of the first switch SW1. The first terminal and the second terminal of the second capacitor C2 are respectively coupled to a second reference voltage VR2 and the second terminal of the second switch SW2. The first terminal and the second terminal of the third capacitor C3 are respectively coupled to the second terminal of the first switch SW1 and the input terminal of the first gain amplifier 410. The first terminal and the second terminal of the fourth capacitor C4 are respectively coupled to the second terminal of the second switch SW2 and the input terminal of the second gain amplifier 420. The first terminal and the second terminal of the fourth switch SW4 are respectively coupled to the input terminal of the first gain amplifier 410 and a bias voltage $V_{BIAS}$. The first terminal and the second terminal of the fifth switch SW5 are respectively coupled to the input terminal of the second gain amplifier 420 and the bias voltage $V_{BIAS}$. The output terminal of the first gain amplifier 410 acts as the first output terminal VOP of the sensor 310_n and is coupled to the first input terminal VIP_GA of the sampling amplifier 320. The output terminal of the second gain amplifier 420 acts as the second output terminal VON of the sensor 310_n and is coupled to the second input terminal VIN_GA of the sampling amplifier 320. According to the present embodiment, the first and second gain amplifiers 410 and 420 may be unit gain amplifiers. Details of the first gain amplifier 410 and/or details of the second gain amplifier 420 may be deduced from relevant descriptions as illustrated in FIG. 5.

When the display panel 230 is operated during the sensing period, in the first period (i.e., the first phase) T1 of the sensing period, the first switch SW1, the second switch SW2, the fourth switch SW4, and the fifth switch SW5 are turned on, and the third switch SW3 is turned off. Hence, in the first period T1, the output VOP(T1) of the first gain amplifier 410 is $V_{BIAS}+V_{offset1}$, and the output VON(T1) of the second gain amplifier 420 is $V_{BIAS}+V_{offset2}$. Here, $V_{offset1}$ represents the voltage offset of the first gain amplifier 410, and $V_{offset2}$ represents the voltage offset of second gain amplifier 420. In the first period T1, the sampling amplifier 320 may perform the following calculation: VOP(T1)−VON(T1)=$(V_{BIAS}+V_{offset1})-(V_{BIAS}+V_{offset2})=V_{offset1}-V_{offset}$. In the second period (i.e., the second phase) T2 of the sensing period, the first switch SW1, the second switch SW2, the fourth switch SW4, and the fifth switch SW5 are turned off, and the third switch SW3 is turned on. Hence, in the second period T2, the output VOP(T2) of the first gain amplifier 410 is $V_{BIAS}+V_{offset1}-$ $$\frac{(D\_n - VCM)}{2},$$

and the output VON(T2) of the second gain amplifier 420 is $V_{BIAS}+$ $$V_{offset2} + \frac{(D\_n - VCM)}{2}.$$

In the second period T2, the sampling amplifier 320 may perform the following calculation: VOP(T2)−VON(T2)= $(V_{offset1}-V_{offset2})-(D\_n-VCM)$, and the sampling amplifier 320 may then perform the following calculation: [VOP(T1)−VON(T1)]−[VOP(T2)−VON(T2)]=D_n−VCM. As a result, the voltage offset $V_{offset1}$ of the first gain amplifier 410 and the voltage offset $V_{offset2}$ of the second gain amplifier 420 may be removed.

Figure 7:
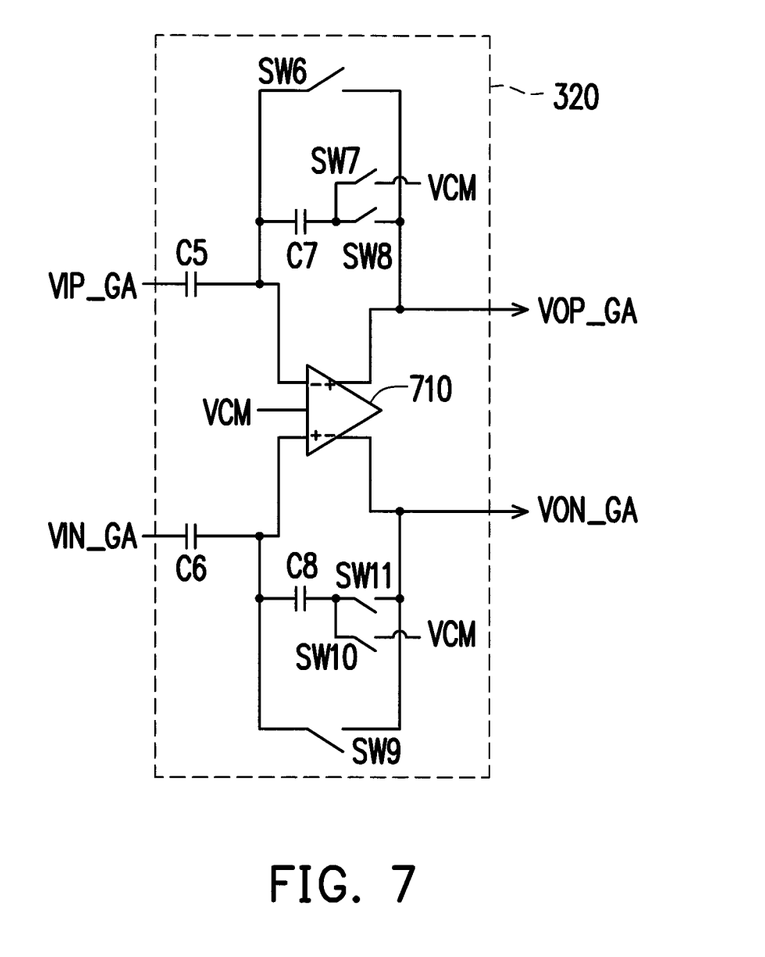
FIG. 7 is a schematic diagram illustrating circuitry of the sampling amplifier according to an embodiment of the invention, and the sampling amplifier is shown in FIG. 3.

FIG. 7 is a schematic diagram illustrating circuitry of the sampling amplifier 320 according to an embodiment of the invention, and the sampling amplifier 320 is shown in FIG. 3. With reference to FIG. 2, FIG. 3, and FIG. 7, the sampling amplifier 320 includes a differential amplifier 710, a fifth capacitor C5, a sixth capacitor C6, a seventh capacitor C7, an eighth capacitor C8, a sixth switch SW6, a seventh switch SW7, an eighth switch SW8, a ninth switch SW9, a tenth switch SW10, and an eleventh switch SW11 The first output terminal (e.g., a non-inverse output terminal) and the second input terminal (e.g., an inverse output terminal) of the differential amplifier 710 are coupled to the first output terminal VOP_GA and the second output terminal VON_GA of the sampling amplifier 320, respectively. The first terminal of the fifth capacitor C5 serves as the first input terminal VIP_GA of the sampling amplifier 320 and is coupled to the first output terminals of the sensors 310_1 to 310_n. The second terminal of the fifth capacitor C5 is coupled to the first input terminal (e.g., the inverse output terminal) of the differential amplifier 710. The first terminal of the sixth capacitor C6 serves as the second input terminal VIN_GA of the sampling amplifier 320 and is coupled to the second output terminals of the sensors 310_1 to 310_n. The second terminal of the sixth capacitor C6 is coupled to the second input terminal (e.g., the non-inverse output terminal) of the differential amplifier 710.

The first terminal of the seventh capacitor C7 is coupled to the first input terminal of the differential amplifier 710. The first terminal of the eighth capacitor C8 is coupled to the second input terminal of the differential amplifier 710. The first terminal and the second terminal of the sixth switch S6 are coupled to the first input terminal and the first output terminal of the differential amplifier 710, respectively. The first terminal and a second terminal of the seventh switch SW7 are respectively coupled to the second terminal of the seventh capacitor C7 and the common mode voltage VCM. The first terminal and a second terminal of the eighth switch SW8 are coupled to the second terminal of the seventh capacitor C7 and the first output terminal of the differential amplifier 710, respectively. The first terminal and the second terminal of the ninth switch SW9 are coupled to the second input terminal and the second output terminal of the differential amplifier 710, respectively. The first terminal and the second terminal of the tenth switch SW10 are respectively coupled to the second terminal of the eighth capacitor C8 and the common mode voltage VCM. The first terminal and a second terminal of the eleventh switch SW11 are coupled to the second terminal of the eighth capacitor C8 and the second output terminal of the differential amplifier 710, respectively. In the present embodiment, the capacitance of the fifth capacitor C5 is equal to that of the sixth capacitor C6, and the capacitance of the seventh capacitor C7 is equal to that of the eighth capacitor C8.

When the display panel 230 is operated during the sensing period, in the first period (i.e., the first phase) T1 of the sensing period, the sixth switch SW6, the seventh switch SW7, the ninth switch SW9, and the tenth switch SW10 are turned on, and the eighth switch SW8 and the eleventh switch SW11 are turned off. Besides, in the first period T1, the charges of the fifth capacitor C5 and the seventh capacitor C7 are $$C5 * \left[ VIP\_GA - \frac{A}{1+A}(VCM + V_{offset}) \right] -$$
$$C7 * \left[ \frac{A}{1+A}(VCM + V_{offset}) - VCM \right],$$

wherein $V_{offset}$ represents the voltage offset of the differential amplifier 710, and A represents the gain of the differential amplifier 710. In the second period T2, the sixth switch SW6, the seventh switch SW7, the ninth switch SW9, and the tenth switch SW10 are turned off, and the eighth switch SW8 and the eleventh switch SW11 are turned on. Besides, in the second period T2, the charges of the fifth capacitor C5 and the seventh capacitor C7 are $$C5 * \left[ VIP\_GA' - \left( VCM + V_{offset} - \frac{VOP\_GA}{A} \right) \right] -$$
$$C7 * \left[ \left( VCM + V_{offset} - \frac{VOP\_GA}{A} \right) - VOP\_GA \right],$$

wherein VIP_GA' represents the voltage at the first input terminal of the differential amplifier 710 during the second period T2.

After the following calculation is made, i.e., $$C5 * \left[ VIP\_GA - \frac{A}{1+A}(VCM + V_{offset}) \right] -$$
$$C7 * \left[ \frac{A}{1+A}(VCM + V_{offset}) - VCM \right] =$$
$$C5 * \left[ VIP\_GA' - \left( VCM + V_{offset} - \frac{VOP\_GA}{A} \right) \right] -$$
$$C7 * \left[ \left( VCM + V_{offset} - \frac{VOP\_GA}{A} \right) - VOP\_GA \right],$$

the following result can be obtained, i.e., $$\left[ C7 - \left( \frac{1+A}{A} \right) + \frac{C5}{A} \right] * VOP\_GA = -C5(VIP\_GA' - VIP\_GA) +$$
$$C7 * VCM + C5 * \left( \frac{1}{1+A} \right) * VCM + C7 * \left( \frac{1}{1+A} \right) * VCM +$$
$$C5 * \left( \frac{1}{1+A} \right) * V_{offset} + C7 * \left( \frac{1}{1+A} \right) * V_{offset}. \text{ Hence,}$$
$$VOP\_GA \approx -\left( \frac{A}{1+A} \right) * \left( \frac{C5}{C7} \right) * (VIP\_GA' - VIP\_GA) +$$
$$\left( \frac{A}{1+A} \right) * VCM + \left[ \frac{A}{(1+A)^2} \right] * \left( \frac{C5}{C7} \right) * VCM + \left[ \frac{A}{(1+A)^2} \right] *$$
$$VCM + \left[ \frac{A}{(1+A)^2} \right] * \left( \frac{C5}{C7} \right) * V_{offset} + \left[ \frac{A}{(1+A)^2} \right] * V_{offset}.$$

As a result, the voltage offset of the differential amplifier 710 may be reduced.

To sum up, the sensing apparatus 300 provided in several embodiments mentioned above is conducive to the reduction of the offset of the amplification circuit in the sensors 310_1 to 310_*n* and/or the sampling amplifier 320. Thereby, the sensing apparatus 300 is able to accurately sense the threshold voltage of the current source transistor 233 in the pixel circuit of the display panel 230.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A sensing apparatus of a display panel, comprising:
    a sensor, an input terminal of the sensor being coupled to a pixel circuit of the display panel via a data line of the display panel, so as to sense a threshold voltage of a current source transistor in the pixel circuit during a sensing period; and
    a sampling amplifier, a first input terminal and a second input terminal of the sampling amplifier being coupled to a first output terminal and a second output terminal of the sensor, respectively,
    the sensor comprising:
        a first switch, a first terminal of the first switch being coupled to the pixel circuit via the data line;
        a second switch, a first terminal of the second switch being coupled to a common mode voltage;
        a third switch, a first terminal and a second terminal of the third switch being respectively coupled to a second terminal of the first switch and a second terminal of the second switch;
        a first capacitor, a first terminal and a second terminal of the first capacitor being respectively coupled to a first reference voltage and the second terminal of the first switch;
        a first gain amplifier, an input terminal of the first gain amplifier being coupled to the second terminal of the first switch, an output terminal of the first gain amplifier acting as the first output terminal of the sensor and being coupled to the first input terminal of the sampling amplifier; and
        a second gain amplifier, an input terminal of the second gain amplifier being coupled to the second terminal of the second switch, an output terminal of the second gain amplifier acting as the second output terminal of the sensor and being coupled to the second input terminal of the sampling amplifier.

2. The sensing apparatus as recited in claim 1, during a first period, the first switch and the second switch being turned on, the third switch being turned off; and
    during a second period, the first switch and the second switch being turned off, the third switch being turned on.

3. The sensing apparatus as recited in claim 1, wherein the first gain amplifier and the second gain amplifier are unit gain amplifiers.

4. The sensing apparatus as recited in claim 1, wherein the sensor further comprises:
    a second capacitor, a first terminal and a second terminal of the second capacitor being respectively coupled to a second reference voltage and the second terminal of the second switch.

5. The sensing apparatus as recited in claim 1, wherein the sensor further comprises:
    a third capacitor coupled between the input terminal of the first gain amplifier and the second terminal of the first switch;
    a fourth capacitor coupled between the input terminal of the second gain amplifier and the second terminal of the second switch;
    a fourth switch, a first terminal and a second terminal of the fourth switch being respectively coupled to the input terminal of the first gain amplifier and a bias voltage; and a fifth switch, a first terminal and a second terminal of the fifth switch being respectively coupled to the input terminal of the second gain amplifier and the bias voltage.

6. The sensing apparatus as recited in claim 5, during a first period, the first switch, the second switch, the fourth switch, and the fifth switch being turned on, the third switch being turned off; and during a second period, the first switch, the second switch, the fourth switch, and the fifth switch being turned off, the third switch being turned on.

7. The sensing apparatus as recited in claim 1, wherein the first gain amplifier comprises:

a current mirror, a first terminal of a master current path of the current mirror and a first terminal of a slave current path of the current mirror being coupled to a system voltage, a second terminal of the slave current path being coupled to the output terminal of the first gain amplifier;

a transistor, a control terminal of the transistor being coupled to the input terminal of the first gain amplifier, a first terminal of the transistor being coupled to a second terminal of the master current path of the current mirror; and a current source coupled to a second terminal of the transistor and the second terminal of the slave current path of the current mirror.

8. The sensing apparatus as recited in claim 1, wherein the sampling amplifier comprises:

a differential amplifier, a first output terminal and a second input terminal of the differential amplifier being coupled to a first output terminal and a second output terminal of the sampling amplifier, respectively;

a fifth capacitor, a first terminal and a second terminal of the fifth capacitor being coupled to the first output terminal of the sensor and a first input terminal of the differential amplifier, respectively;

a sixth capacitor, a first terminal and a second terminal of the sixth capacitor being coupled to the second output terminal of the sensor and a second input terminal of the differential amplifier, respectively;

a seventh capacitor, a first terminal of the seventh capacitor being coupled to the first input terminal of the differential amplifier;

an eighth capacitor, a first terminal of the eighth capacitor being coupled to the second input terminal of the differential amplifier;

a sixth switch, a first terminal and a second terminal of the sixth switch being coupled to the first input terminal and the first output terminal of the differential amplifier, respectively;

a seventh switch, a first terminal and a second terminal of the seventh switch being respectively coupled to a second terminal of the seventh capacitor and the common mode voltage;

an eighth switch, a first terminal and a second terminal of the eighth switch being coupled to the second terminal of the seventh capacitor and the first output terminal of the differential amplifier, respectively;

a ninth switch, a first terminal and a second terminal of the ninth switch being coupled to the second input terminal and the second output terminal of the differential amplifier, respectively;

a tenth switch, a first terminal and a second terminal of the tenth switch being respectively coupled to a second terminal of the eighth capacitor and the common mode voltage; and an eleventh switch, a first terminal and a second terminal of the eleventh switch being coupled to the second terminal of the eighth capacitor and the second output terminal of the differential amplifier, respectively.

9. The sensing apparatus as recited in claim 8, during a first period, the first switch, the second switch, the sixth switch, the seventh switch, the ninth switch, and the tenth switch being turned on, the third switch, the eighth switch, and the eleventh switch being turned off; and during a second period, the first switch, the second switch, the sixth switch, the seventh switch, the ninth switch, and the tenth switch being turned off, the third switch, the eighth switch, and the eleventh switch being turned on.

10. A sensing apparatus of a display panel, comprising:

a sensor, an input terminal of the sensor being coupled to a pixel circuit of the display panel via a data line of the display panel, so as to sense a threshold voltage of a current source transistor in the pixel circuit during a sensing period; and a sampling amplifier, a first input terminal and a second input terminal of the sampling amplifier being coupled to a first output terminal and a second output terminal of the sensor, respectively, the sampling amplifier comprising:

a differential amplifier, a first output terminal and a second output terminal of the differential amplifier being coupled to a first output terminal and a second output terminal of the sampling amplifier, respectively;

a first capacitor, a first terminal and a second terminal of the first capacitor being coupled to the first output terminal of the sensor and a first input terminal of the differential amplifier, respectively;

a second capacitor, a first terminal and a second terminal of the second capacitor being coupled to the second output terminal of the sensor and a second input terminal of the differential amplifier, respectively;

a third capacitor, a first terminal of the third capacitor being coupled to the first input terminal of the differential amplifier;

a fourth capacitor, a first terminal of the fourth capacitor being coupled to the second input terminal of the differential amplifier;

a first switch, a first terminal and a second terminal of the first switch being coupled to the first input terminal and the first output terminal of the differential amplifier, respectively;

a second switch, a first terminal and a second terminal of the second switch being respectively coupled to a second terminal of the third capacitor and a common mode voltage;

a third switch, a first terminal and a second terminal of the third switch being coupled to the second terminal of the third capacitor and the first output terminal of the differential amplifier, respectively;

a fourth switch, a first terminal and a second terminal of the fourth switch being coupled to the second input terminal and the second output terminal of the differential amplifier, respectively;

a fifth switch, a first terminal and a second terminal of the fifth switch being respectively coupled to a second terminal of the fourth capacitor and the common mode voltage; and a sixth switch, a first terminal and a second terminal of the sixth switch being coupled to the second terminal of the fourth capacitor and the second output terminal of the differential amplifier, respectively.

11. The sensing apparatus as recited in claim 10, during a first period, the first switch, the second switch, the fourth switch, and the fifth switch being turned on, the third switch and the sixth switch being turned off; and during a second period, the first switch, the second switch, the fourth switch, and the fifth switch being turned off, the third switch and the sixth switch being turned on.

12. The sensing apparatus as recited in claim 10, wherein the sensor comprises:

a seventh switch, a first terminal of the seventh switch being coupled to the pixel circuit via the data line;

an eighth switch, a first terminal of the eighth switch being coupled to the common mode voltage;

a ninth switch, a first terminal and a second terminal of the ninth switch being respectively coupled to a second terminal of the seventh switch and a second terminal of the eighth switch;

a fifth capacitor, a first terminal and a second terminal of the fifth capacitor being respectively coupled to a first reference voltage and the second terminal of the seventh switch;

a sixth capacitor, a first terminal and a second terminal of the sixth capacitor being respectively coupled to a second reference voltage and the second terminal of the eighth switch;

a first gain amplifier, an input terminal of the first gain amplifier being coupled to the second terminal of the seventh switch, an output terminal of the first gain amplifier acting as the first output terminal of the sensor and being coupled to the first input terminal of the sampling amplifier; and a second gain amplifier, an input terminal of the second gain amplifier being coupled to the second terminal of the eighth switch, an output terminal of the second gain amplifier acting as the second output terminal of the sensor and being coupled to the second input terminal of the sampling amplifier.

13. The sensing apparatus as recited in claim 12, during a first period, the first switch, the second switch, the fourth switch, the fifth switch, the seventh switch, and the eighth switch being turned on, the third switch, the sixth switch, and the ninth switch being turned off; and during a second period, the first switch, the second switch, the fourth switch, the fifth switch, the seventh switch, and the eighth switch being turned off, the third switch, the sixth switch, and the ninth switch being turned on.

14. The sensing apparatus as recited in claim 12, wherein the first gain amplifier and the second gain amplifier are unit gain amplifiers.

15. The sensing apparatus as recited in claim 12, wherein the first gain amplifier comprises:

a current mirror, a first terminal of a master current path of the current mirror and a first terminal of a slave current path of the current mirror being coupled to a system voltage, a second terminal of the slave current path being coupled to the output terminal of the first gain amplifier;

a transistor, a control terminal of the transistor being coupled to the input terminal of the first gain amplifier, a first terminal of the transistor being coupled to a second terminal of the master current path of the current mirror; and a current source coupled to a second terminal of the transistor and the second terminal of the slave current path of the current mirror.

16. The sensing apparatus as recited in claim 10, wherein the sensor comprises:

a seventh switch, a first terminal of the seventh switch being coupled to the pixel circuit via the data line;

an eighth switch, a first terminal of the eighth switch being coupled to the common mode voltage;

a ninth switch, a first terminal and a second terminal of the ninth switch being respectively coupled to a second terminal of the seventh switch and a second terminal of the eighth switch;

a fifth capacitor, a first terminal and a second terminal of the fifth capacitor being respectively coupled to a first reference voltage and the second terminal of the seventh switch;

a sixth capacitor, a first terminal and a second terminal of the sixth capacitor being respectively coupled to a second reference voltage and the second terminal of the eighth switch;

a seventh capacitor, a first terminal of the seventh capacitor being coupled to the second terminal of the seventh switch;

an eighth capacitor, a first terminal of the eighth capacitor being coupled to the second terminal of the eighth switch;

a first gain amplifier, an input terminal of the first gain amplifier being coupled to a second terminal of the seventh capacitor, an output terminal of the first gain amplifier acting as the first output terminal of the sensor and being coupled to the first input terminal of the sampling amplifier;

a second gain amplifier, an input terminal of the second gain amplifier being coupled to a second terminal of the eighth capacitor, an output terminal of the second gain amplifier acting as the second output terminal of the sensor and being coupled to the second input terminal of the sampling amplifier;

a tenth switch, a first terminal and a second terminal of the tenth switch being respectively coupled to the input terminal of the first gain amplifier and a bias voltage; and an eleventh switch, a first terminal and a second terminal of the eleventh switch being respectively coupled to the input terminal of the second gain amplifier and the bias voltage.

17. The sensing apparatus as recited in claim 16, during a first period, the first switch, the second switch, the fourth switch, the fifth switch, the seventh switch, the eighth switch, the tenth switch, and the eleventh switch being turned on, the third switch, the sixth switch, and the ninth switch being turned off; and during a second period, the first switch, the second switch, the fourth switch, the fifth switch, the seventh switch, the eighth switch, the tenth switch, and the eleventh switch being turned off, the third switch, the sixth switch, and the ninth switch being turned on.

* * * * *